United States Patent [19]

Hall

[11] Patent Number: 4,458,334

[45] Date of Patent: Jul. 3, 1984

[54] REDUNDANCY MAP STORAGE FOR BUBBLE MEMORIES

[75] Inventor: James B. Hall, Austin, Tex.

[73] Assignee: Texas Instruments Incorporated, Dallas, Tex.

[21] Appl. No.: 796,934

[22] Filed: May 16, 1977

[51] Int. Cl.$^3$ ............................................. G11C 19/08
[52] U.S. Cl. ........................................ 365/1; 365/12; 365/15
[58] Field of Search ............... 340/174 TF; 365/1, 12, 365/15

[56] References Cited

U.S. PATENT DOCUMENTS

| | | | |
|---|---|---|---|
| 3,792,450 | 2/1974 | Bogar et al. | 340/174 TF |
| 3,909,810 | 9/1975 | Naden et al. | 365/15 |
| 3,997,877 | 12/1976 | Naden . | |
| 4,073,012 | 2/1978 | Ohnigian et al. | 365/15 |
| 4,090,251 | 5/1978 | Flannigan et al. | 365/12 |
| 4,354,253 | 10/1982 | Naden | 365/15 |

Primary Examiner—James W. Moffitt
Attorney, Agent, or Firm—William E. Hiller; James T. Comfort; Melvin Sharp

[57] ABSTRACT

A magnetic bubble domain memory device is provided that includes a magnetic bubble domain data chip having a major/minor loop organization in which one or more defective minor loops may be tolerated. Information in the form of a redundancy map is stored within the plurality of minor loops in a single page thereof, where a page is defined as one bit of information from the same virtual position on each of the plurality of minor loops. This redundancy map comprises firmware wherein the presence of a magnetic bubble domain within the designated page at a specified bit position identifies the particular minor loop corresponding to that bit position as a good loop, and conversely the absence of a bubble within the page at a specified bit position identifies the particular minor loop corresponding to that bit position as a defective loop.

7 Claims, 2 Drawing Figures

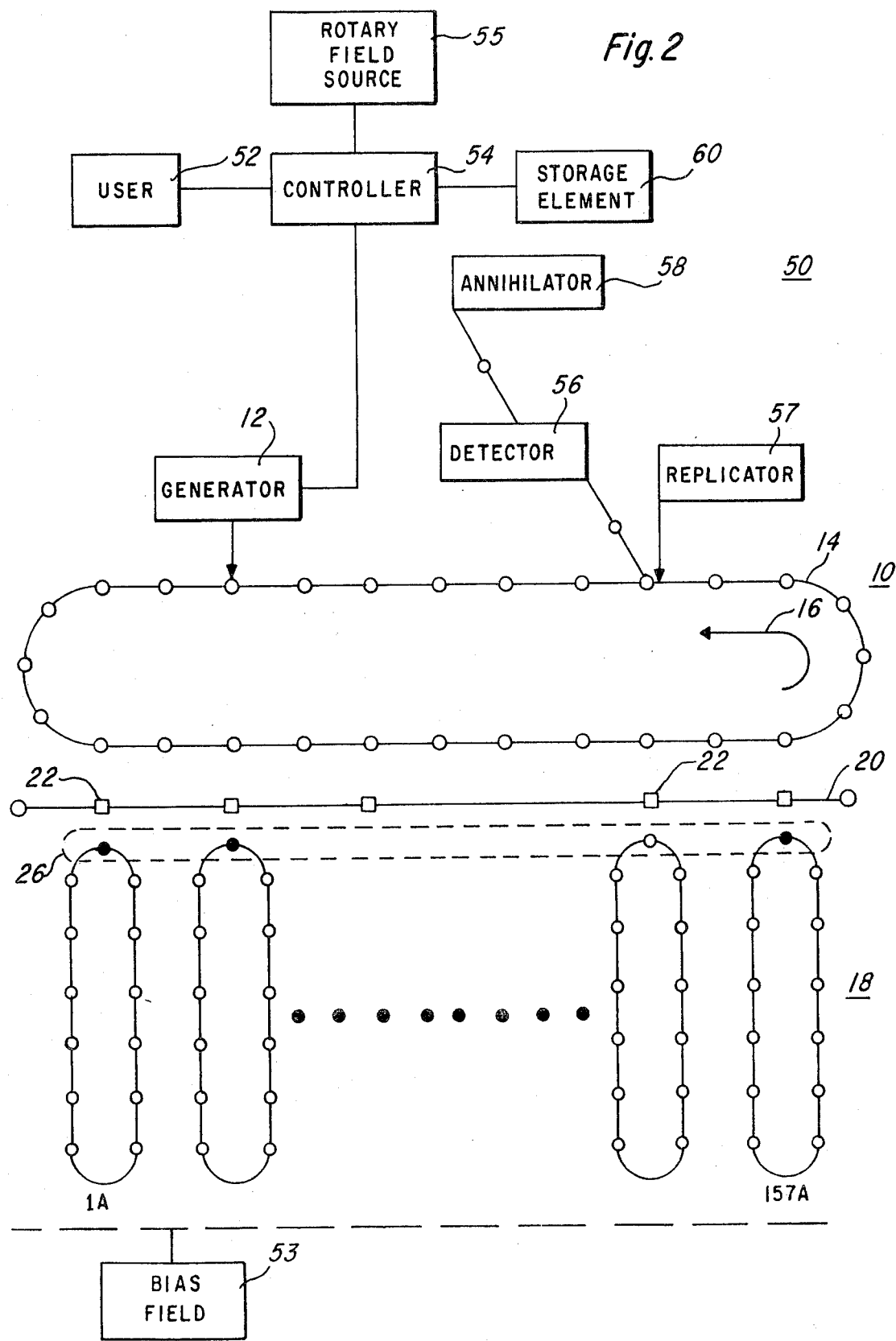

REDUNDANCY MAP STORAGE FOR BUBBLE MEMORIES

BACKGROUND OF THE INVENTION

The present invention pertains to a magnetic domain memory system and more particularly to the utilization of a device having one or more defective storage areas which are incapable of propagating magnetic domains.

DESCRIPTION OF THE PRIOR ART

In recent years, tremendous progress has been made in developing equipment for electronic data processing such that today high speed reliable hardware is available to the data processing designer. The newly developed electronic components, particularly those using integrated circuits, have greatly increased the capacity of modern electronic data processing equipment to process data. As the speed and capacity of processing have increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extremely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics,* Vol. MAG-5, No. 3 (1969), pp. 544–553, "Application of Orthoferrites to Domain—Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction out of the plane and that small localized single domain regions of magnetic polarization aligned opposite to the general polarization direction may be supported. Such localized regions which are generally cylindrical in configuration represent binary memory bits. Interest in these devices in large part is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such material as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto and by a separate write connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically, all of the minor loops in the chip, upon command, transfer in parallel the bubbles from their corresponding positions to the major loop. The bubbles are then serially detected as they are propagated past a read position. New data may also be inserted at a write position for parallel transfer back into the minor loops at an appropriate time later (when major loop magnetic domain propagation aligns the data for transfer).

Simultaneous reading or writing of data into a grouping of related major loops gives the capacity of treating related magnetic domains as digital or other coded words. Time multiplexed groups of data chips permit reading and writing of data in a time sharing fashion to permit an overall memory data rate greater than that permitted by magnetic domain propagation in a single chip.

Another structural organization of operable magnetic domains is the block replicate organization, also well known in the art. This organization is presented in an article appearing in *AIP Conference Proceedings on Magnetism and Magnetic Materials,* No. 29 (1975), pp. 51–53, entitled "64K Fast Access Chip Design". The block replicate organization includes open ended major propagation paths which may be established by an arrangement of T-bar permalloy circuits on, for example, a rare earth orthoferrite platelet. These major propagation paths are aligned adjacent to a plurality of minor loops. Data is written into the minor loops from a major propagation path by way of a swap transfer gate. Old data is transferred into the major propagation paths by a swap signal received from a controller chip and is ultimately annihilated. A subsequent swap signal transfers new data into the minor loops where it becomes nonvolatile. To read data out of the minor loops in a block replicate organization, it is necessary to read out the magnetic domains onto separate major propagation paths. A replicate gate between the minor loops and the major propagation paths allows the stored data to remain within the minor loops with the data that is read out onto the major propagation path being a replicated version of the stored data. The major distinction between a block replicate organization and a major-minor loop organization is that the data stored within the minor loops remains in the minor loops during the read operation mode in a block replicate while the stored data is transferred completely out onto a major propagation path before replication to a user system in a major-minor loop organization. Also since it is not physically possible to locate the minor loops so as to take advantage of all locations on the major propagation paths, the rate of bubble movement within the respective minor loops is greater than that possible at the detector. In order to overcome this physical disability, the major propagation paths in the block-replicate organization at the output for the reading of the minor loops are merged. Making one major propagation path shorter by one position as compared to another major propagation path allows a merger of the two paths with one path complementing the voids present in the other path. The result of the merger is to double the data rate out of the minor loops to the detector making it equal to the rate within the minor loops.

In both the block replicate organization and the major-minor loop organization, unless special provision is made, every loop in every chip of the system must be perfect for the system to perform satisfactorily. Since chips contain entire groupings of registers, a defect in one of the minor loops would require discarding the entire chip. Various techniques have been proposed in the art for permitting the use of a magnetic domain chip even though one or more of its minor loops may be defective. Exemplary techniques are described, for example, in U.S. Pat. No. 3,909,810 entitled "Bubble Memory Minor Loop Redundancy Scheme", which is assigned to the assignee of the present invention and "Fault-Tolerant Memory Organization": "Impact on Chip Yield and System Cost", *IEEE Transactions Magnetics*, September, 1974. These techniques utilize separate magnetic domain chips to store locations of defective loops. A further example of a technique to overcome this deficiency is found in pending U.S. patent application Ser. No. 594,901 filed July 10, 1975, now U.S. Pat. No. 4,070,651 issued Jan. 24, 1978 and entitled "Magnetic Domain Minor Loop Redundancy System" also assigned to the assignee of the present invention. The technique described therein is an important step in development of a system using data chips with defective minor loops. Generally, what is disclosed therein is the use of a non-volatile semiconductor memory, such as a programmable read-only-memory, to store data identifying the relative positions of defective minor loops to each other. This data is used to control logic so that a stream of data bubbles to be transferred into the minor loops for storage, for example, contains intermittent voids corresponding to defective minor loop locations. This latter technique is especially beneficial for storing redundancy data designating defective minor loops in a series of magnetic bubble data chips in a magnetic bubble domain system. A further improvement on this technique is found in pending U.S. patent application Ser. No. 752,947 filed Dec. 17, 1976, entitled "Bubble Redundancy Map Storage Using Non-Volatile Semiconductor Memory", now U.S. Pat. No. 4,354,253 issued Oct. 12, 1982, which is also assigned to the assignee of the present invention. This improvement provides for the redundancy data to be stored in an erasable non-volatile semiconductor memory to facilitate magnetic bubble data chip replacement without having to replace the entire array of redundancy data for all data chips within a magnetic domain system.

A further problem found in accessing stored data from a magnetic domain system is the requirement to know at any time the location of specific data stored within the minor loops. In order to be able to locate this data, it is necessary to know when the input or output absolute address in the minor loop and page address in the minor loop containing the data coincide. The minor loop is partitioned into a number of positions capable of supporting and storing magnetic domains, these positions being the absolute addresses of the minor loop. However, the nature of the magnetic domain device is to move individual magnetic domains through each of the positions of the minor loop, and thus each magnetic domain has a page address it retains as it propagates through each absolute address. The absolute address nearest the swap transfer gate may be designated as the input absolute address, while the absolute address nearest to the replicate gate may be designated as the output absolute address. When a user asks for a specific piece of data, although the page address for the data is known, in order to read it out the user must also know at which absolute address it is located so that a control signal can move that page to the appropriate absolute address.

An alternative scheme for providing redundancy patterns for screening defective minor loops comprises storing said redundancy pattern on the data chip itself. An example of this technique can be found in pending U.S. patent application Ser. No. 767,852 filed Feb. 11, 1977, entitled "Magnetic Bubble Memory Chip Synchronization and Redundancy", now U.S. Pat. No. 4,159,412 issued June 26, 1979, which is also assigned to the assignee of the present invention. This technique provides for storing a redundancy pattern and a synchronization pattern in a minor loop set aside specifically for this purpose. This data is accessed by the user and used to screen out defective minor loops that are labeled in the redundancy pattern. At a point in time when a predetermined synchronization pattern is found, the user then is capable of accessing any page knowing the absolute address of the present available page. This technique, however, requires the dedication of an entire minor loop to storing the synchronization and redundancy patterns.

SUMMARY OF THE INVENTION

In accordance with the present invention, it is proposed to use storage areas within a magnetic domain memory device for recording the locations of defective areas on a thin magnetic film capable of supporting magnetic domains. Since these defective areas are not capable of propagating magnetic domains, it is desirable to inhibit data from being stored therein.

A preferred magnetic domain memory device in accordance with the present invention includes a thin film capable of supporting magnetic domains divided into sections thereby defining a major propagation path and a plurality of minor paths aligned adjacent thereto. Respective transfer gates are formed between the major propagation path and each of the plurality of minor paths to allow for movement of magnetic domains therebetween. The major/minor loop chip concept is applicable to all memories comprised of multiple data loops which communicate with serial input/output tracks at least at one point on each data loop. Pulse conductor means are used to transfer the magnetic domains through the transfer gates on command. Detector means are connected to the major path to detect the presence or absence of magnetic bubble domains.

Each data chip must contain a predetermined number of operable minor loops to fulfill device performance requirements. Although the device may have a greater number of operable minor loops, that is those able to propagate magnetic domains, only the first predetermined number of operable loops will be utilized. A redundancy loop pattern is present in the storage areas of the minor loops. The presence of a magnetic domain in any one minor loop is representative of the operability of that minor loop, while conversely the absence of a magnetic domain is representative of the defectiveness of that minor loop. Device synchronization may also be realized by identifying and tracking the redundancy loop pattern.

A magnetic domain memory system in accordance with the present invention utilizes the magnetic domain memory device described above in cooperation with a user system which may be in the form of a microprocessor, a controller further cooperating with a storage element for controlling the reading from and writing to the storage areas within the device while screening data from the inoperable minor loops.

BRIEF DESCRIPTION OF THE DRAWINGS

FIG. 2 is a diagram partly in block form and partly in schematic form of a magnetic domain memory system in accordance with the present invention.

DETAILED DESCRIPTION OF THE DRAWINGS

Figure 1:
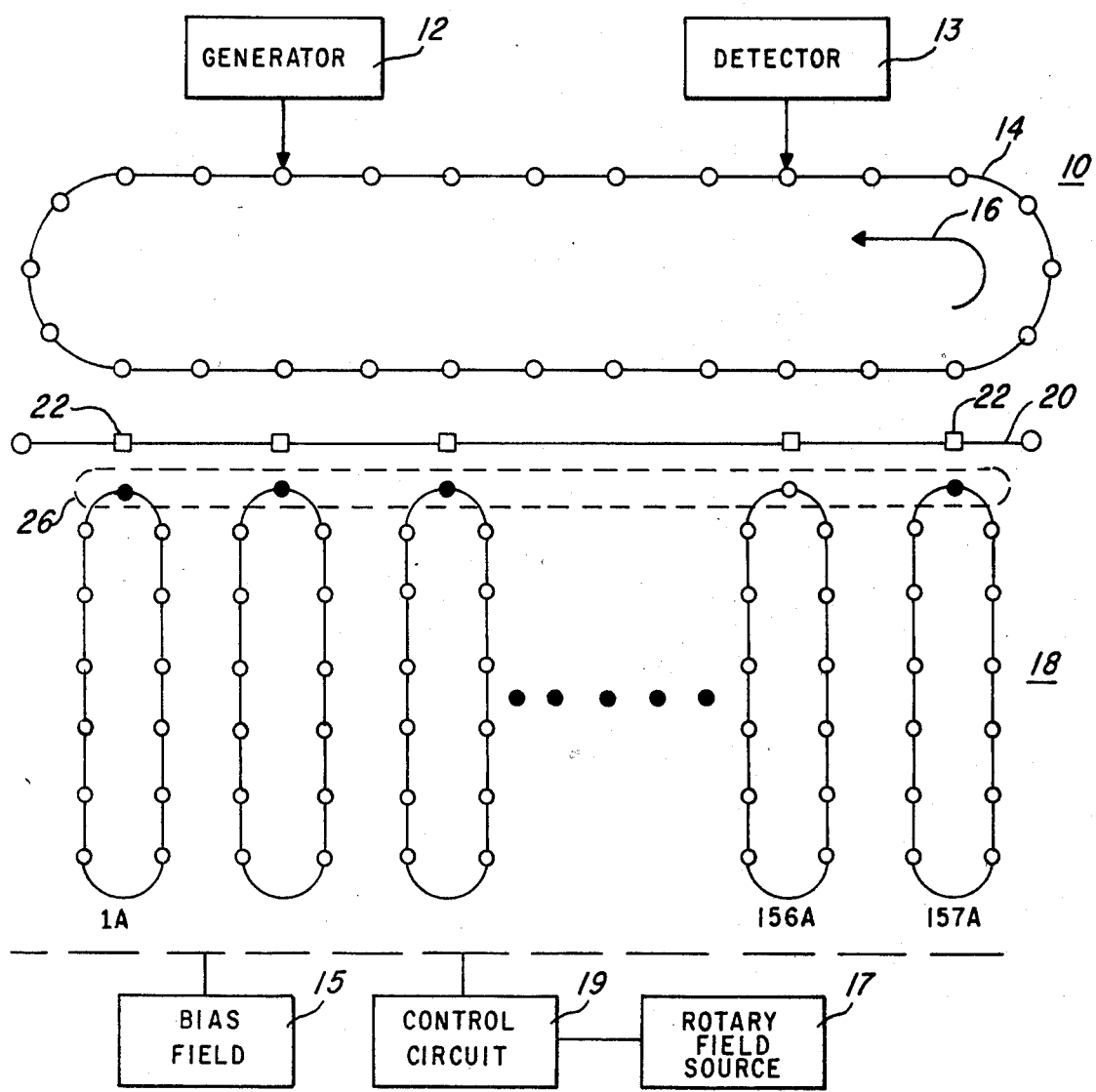
FIG. 1 is a diagram partly in block form and partly in schematic form of a magnetic domain device in accordance with the present invention.

Referring now to the drawings and more particularly to FIG. 1, a major-minor loop magnetic domain memory device 10 is illustrated. In a preferred embodiment shown in FIG. 1, a bubble generator 12 generates magnetic domains onto a major propagation loop 14 which contains a number of positions capable of supporting magnetic domains. Bubble size is maintained by the bias field 15. Once in the major loop 14, magnetic domains are circularly propagated in transfer direction 16 by an in-plane rotating magnetic field source 17, connected to a control circuit 19 for controlling transfer operations. The bubbles are detected by a detector 13 connected to major loop 14.

Aligned adjacent to major loop 14 are a series of identical minor loops 18. By way of illustration only, the plurality of minor loops 18 comprise 157 minor loops designated 1A-157A. The number and size of the minor loops are dependent upon the chip capacity needed for any one application. Minor loops 1A-157A are disposed adjacent to major loop 14 in a perpendicular fashion and interact with major loop 14 through transfer line 20 which contains in a serially connected fashion swap transfer gates 22 for each minor loop.

A transfer pulse is applied to transfer line 20 which causes the magnetic domains or the absence of magnetic domains, which are located on the major propagation path 14 to be moved to or from the minor loops 1A-157A, by way of the two way transfer gates 22.

Magnetic domains are located within the minor loops 1A-157A at fixed storage locations, or addresses. A page of information can be defined as a series of bit positions read simultaneously onto the major loop 14 from an identical address on each of the minor loops 1A-157A. Firmware in the form of a series of magnetic bubble domains and voids is stored in the first page of minor loops 1A-157A. This firmware represents a redundancy loop map designating operable and inoperable minor loops. In those minor loops that are operable, that is capable of propagating magnetic domains, a magnetic domain is present. In those minor loops that are inoperable there is an absence of a magnetic domain in the series.

All defective minor loops can be readily identified since the only mode of failure in a minor loop is the inability to propagate a bubble. A bubble is generated by generator 12 and propagated in each minor loop identified as being operable. In each bubble device 10 a predetermined number of minor loops 18 must be operable for minimum performance requirements. Even if a greater number of minor loops 18 are found to be operable, only the first predetermined number of good loops are designated to be good by placing a magnetic bubble domain therein.

Since the redundancy map has a series of magnetic domains and voids and the number of magnetic domains is known, it is possible to identify the redundancy map if no other page contains that number of magnetic domains. Once the page location of the redundancy map is known, a page counter found in control circuit 19 could be utilized to synchronize the bubble device by counting the pages as they are rotated in the minor loops 18 returning to zero when the redundancy map is present at the transfer line 20.

Referring now to FIG. 2 a magnetic domain memory system 50 is illustrated using the magnetic domain memory device 10 illustrated in FIG. 1 and described above. In the magnetic domain memory system 50, a user system 52 which may be in the form of a microprocessor such as that marketed by Texas Instruments Incorporated, Dallas, Tex., Model No. TMS 9980 cooperates with a controller unit 54 to direct the generation and movement of magnetic domains with the aid of the rotary field source 55 in the magnetic domain memory device 10. The controller unit 54 may be in the form of control circuitry such as that marketed by Texas Instruments Incorporated, Dallas, Tex., Model No. TMS 5502. A bias field 53 maintains the bubble domain size.

Once magnetic domains are transferred to the major loop 14, the magnetic domains will propagate to a point on the major loop 14 where they are replicated, that is split into two sections with one part continuing along major loop 14 and the second part propagated along a path leading to a detector 56. Detector 56 will detect the presence or absence of a magnetic domain on that propagation cycle after which the magnetic domains move to an annihilator 58 which may be in the form of a permanent magnet having a polarity different from that of the magnetic domains and thus absorbing them.

Operationally, user 52 will interact with controller 54 to read data from the plurality of minor loops 18 or to write data using generator 12 and propagating the generated magnetic domains around major loop 14 until they are disposed opposite to the plurality of minor loops 18 to be transferred therein by pulsing transfer line 20. The magnetic domains are transferred by way of the two way transfer gates 22. However, in order to inhibit data from being read from or written into those minor loops which are inoperable, the user will first access firmware 26 from the first page within minor loops 18 propagating them along major loop 14 until such a point where they can be replicated and detected. The controller 54 will then read information designating the inoperable minor loops based upon the absence of magnetic domains detected by detector 56 into a storage element 60. Such storage element 60 may be in the form of a shift register such as a shift register marketed by Texas Instruments Incorporated, Dallas, Tex., Model No. TMS 3120, or a random access memory such as the Random Access Memory marketed by Texas Instruments Incorporated, Dallas, Tex., Model No. TMS 4043. Thus the firmware 26 is always present in the magnetic memory device 10 and can be accessed by user 52 in cooperation with controller 54 and the other peripheral devices as replicator 57 and detector 56. The single purpose of retaining the firmware on the chip itself is to avoid the overhead of software within any user system to provide for redundancy identification in the event of a power failure or upon reinitialization after the data is no longer present in the storage element 60.

While the present invention has been described in relation to specific embodiments, it should be apparent to those skilled in the art that various modifications may be made without departing from the spirit and scope of the present invention. For example, instead of the use of a major-minor loop architecture a block replicate architecture, may be utilized with the firmware 26 stored in the plurality of minor loops provided.

What is claimed is:
1. A magnetic domain memory device comprising:
   a magnetic film capable of supporting magnetic domains;
   a major propagation path disposed on said magnetic film for propagating said magnetic domains;
   a plurality of minor loops disposed on said magnetic film adjacent to said major propagation path for storing said magnetic domains with one or more of said minor loops being inoperable, each of said minor loops having a plurality of bit positions for the storage of data as represented by a magnetic domain or a void and the total number of bit positions for each respective minor loop being the same;
   transfer means disposed on said magnetic film between said major propagation path and said plurality of minor loops for transferring magnetic domains therebetween at a single absolute address of a bit position for each of said plurality of minor loops;
   firmware means disposed in said plurality of minor loops for identifying which ones of said minor loops are inoperable and permanently retained by said magnetic film either on said major propagation path or said plurality of minor loops depending upon the particular phase of the operational cycle in effect for said magnetic domain memory device, said firmware means comprising
   a plurality of bit positions extending across said plurality of minor loops and made up of a single bit position from each of said plurality of minor loops and disposed in the same virtual bit position therein common to each of said minor loops for defining a page of data,
   said page of data comprising a series of magnetic domains and voids located respectively at individual bit positions included in said page of data, one of said magnetic domains and voids representing an operable minor loop, and the other of said magnetic domains and voids representing an inoperable minor loop; and
   control means for regulating the operational cycle of said magnetic domain memory device, said control means being operably associated with said magnetic film to impart propagating movement to said magnetic domains from one storage position at one absolute address to another storage position at another absolute address;
   said control means including a page counter having a predetermined total count corresponding to the number of bit positions provided in each minor loop, said page counter being set at a reference number when said page of data identifying which ones of said minor loops are operable and inoperable is disposed in juxtaposition to said transfer means in which each of said common bit positions defining said page of data is located at said absolute address, said page counter changing the count one number unit for each propagation movement of said bit positions of said plurality of minor loops and returning to said reference number when said minor loop operability identifying page of data makes a complete circuit of the absolute addresses for the bit positions of each of said minor loops to provide synchronization of said plurality of minor loops with respect to the data stored therein as represented by a magnetic domain or a void, wherein said minor loop operability identifying page of data is continuously retained either on said major propagation path or on said plurality of minor loops in the same virtual bit position therein common to each of said minor loops.

2. A magnetic domain memory device as set forth in claim 1, wherein said page counter changes the count one number unit for each propagation movement of said bit positions of said plurality of minor loops by incrementing the count.

3. A magnetic domain memory device as set forth in claim 1, wherein said major propagation path is a major loop extending lengthwise across said plurality of minor loops in spaced relationship to corresponding ends thereof.

4. A magnetic domain memory device as set forth in claim 1, wherein said magnetic domains in said page of data represent operable minor loops, and said voids in said page of data represent inoperable minor loops.

5. A magnetic domain memory system comprising:

a magnetic film capable of supporting magnetic domains;

a major propagation path disposed on said magnetic film for propagating said magnetic domains;

a plurality of minor loops disposed on said magnetic film adjacent to said major propagation path for storing said magnetic domains with one or more of said minor loops being inoperable, each of said minor loops having a plurality of bit positions for the storage of data as represented by a magnetic domain or a void and the total number of bit positions for each respective minor loop being the same;

transfer means disposed on said magnetic film between said major propagation path and said plurality of minor loops for transferring magnetic domains therebetween at a single absolute address of a bit position for each of said plurality of minor loops;

firmware means disposed in said plurality of minor loops for identifying which ones of said minor loops are inoperable and permanently retained by said magnetic film either on said major propagation path or said plurality of minor loops depending upon the particular phase of the operational cycle in effect for said magnetic domain memory system, said firmware means comprising a plurality of bit positions extending across said plurality of minor loops and made up of a single bit position from each of said plurality of minor loops and disposed in the same virtual bit position therein common to each of said minor loops for defining a page of data, said page of data comprising a series of magnetic domains and voids located respectively at individual bit positions included in said page of data, one of said magnetic domains and voids representing an operable minor loop, and the other of said magnetic domains and voids representing an inoperable minor loop;

generator means operably coupled to said magnetic film and being operably associated with said major propagation path at a single absolute address of a bit position thereon for generating magnetic domains within said magnetic film for introduction onto said major propagation path at said absolute address of a bit position thereon;

means for detecting the presence of magnetic domains connected to and operably associated with said major propagation path at an absolute address of a bit position thereon;

replicate means operably associated with said major propagation path at an absolute address of a bit position thereon for splitting a magnetic domain incident thereon into two separate magnetic domains, one of which is transferred to said means for detecting the presence of magnetic domains and the other to be retained in its same virtual bit position for propagation on said major propagation path; and control means for regulating the operational cycle of said magnetic domain memory system, said control means being operably associated with said magnetic film to impart propagating movement to said magnetic domains from one storage position at one absolute address to another storage position at another absolute address;

said control means including a page counter having a predetermined total count corresponding to the number of bit positions provided in each minor loop, said page counter being set at a reference number when said page of data identifying which ones of said minor loops are operable and inoperable is disposed in juxtaposition to said transfer means in which each of said common bit positions defining said page of data is located at said absolute address, said page counter changing the count one number unit for each propagation movement of said bit positions of said plurality of minor loops and returning to said reference number when said minor loop operability identifying page of data makes a complete circuit of the absolute addresses for the bit positions of each of said minor loops to provide synchronization of said plurality of minor loops with respect to the data stored therein as represented by a magnetic domain or a void, wherein said minor loop operability identifying page of data is continuously retained either on said major propagation path or on said plurality of minor loops in the same virtual bit position therein common to each of said minor loops.

6. A magnetic domain memory system as set forth in claim 5, further including command means operably connected to said control means and cooperating therewith for directing the actuation thereof; and storage means connected to said control means for storing information based upon said minor loop operability identifying page of data designating said inoperable minor loops.

7. A magnetic domain memory system as set forth in claim 5 wherein said command means comprises a microprocessor.

* * * * *